United States Patent [19]

Mullen

[11] Patent Number: 4,857,133
[45] Date of Patent: Aug. 15, 1989

[54] METHOD AND APPARATUS FOR BONDING WITH CONSISTENT UNIFORM BOND THICKNESS

[75] Inventor: Gerald G. Mullen, Torrance, Calif.
[73] Assignee: Hybond, Inc., Escondido, Calif.
[21] Appl. No.: 196,321
[22] Filed: May 20, 1988
[51] Int. Cl.$^4$ ............................................. B23K 1/02
[52] U.S. Cl. ..................................... 156/378; 29/740
[58] Field of Search ................. 156/64, 360, 378; 29/740; 228/10, 9

[56] References Cited

U.S. PATENT DOCUMENTS

| | | | |
|---|---|---|---|
| 4,393,579 | 7/1983 | Van Hooreweder | 29/740 |
| 4,598,853 | 7/1986 | Hill | 228/10 X |
| 4,720,035 | 1/1988 | Isogai | 228/10 X |
| 4,762,578 | 8/1988 | Burgin | 29/740 X |

OTHER PUBLICATIONS

Memorandum of Apr. 28, 1986 from Johnson Matthey Inc.
Processing Guidelines JM 4613 and JM 4720 from Johnson Matthey Inc.
Technical Service Bulletin of Jul. 1, 1986 from Johnson Matthey Inc.

*Primary Examiner*—David Simmons
*Attorney, Agent, or Firm*—Christie, Parker & Hale

[57] ABSTRACT

A method and apparatus are disclosed for bonding a semiconductor die to a semiconductor circuit package base with silver glass paste. Consistent and uniform bond thickness is achieved by first positioning the die so that it is in contact with the package base and recording this position, then offsetting the position of the die a measured distance from the recorded position using a micrometer.

2 Claims, 3 Drawing Sheets

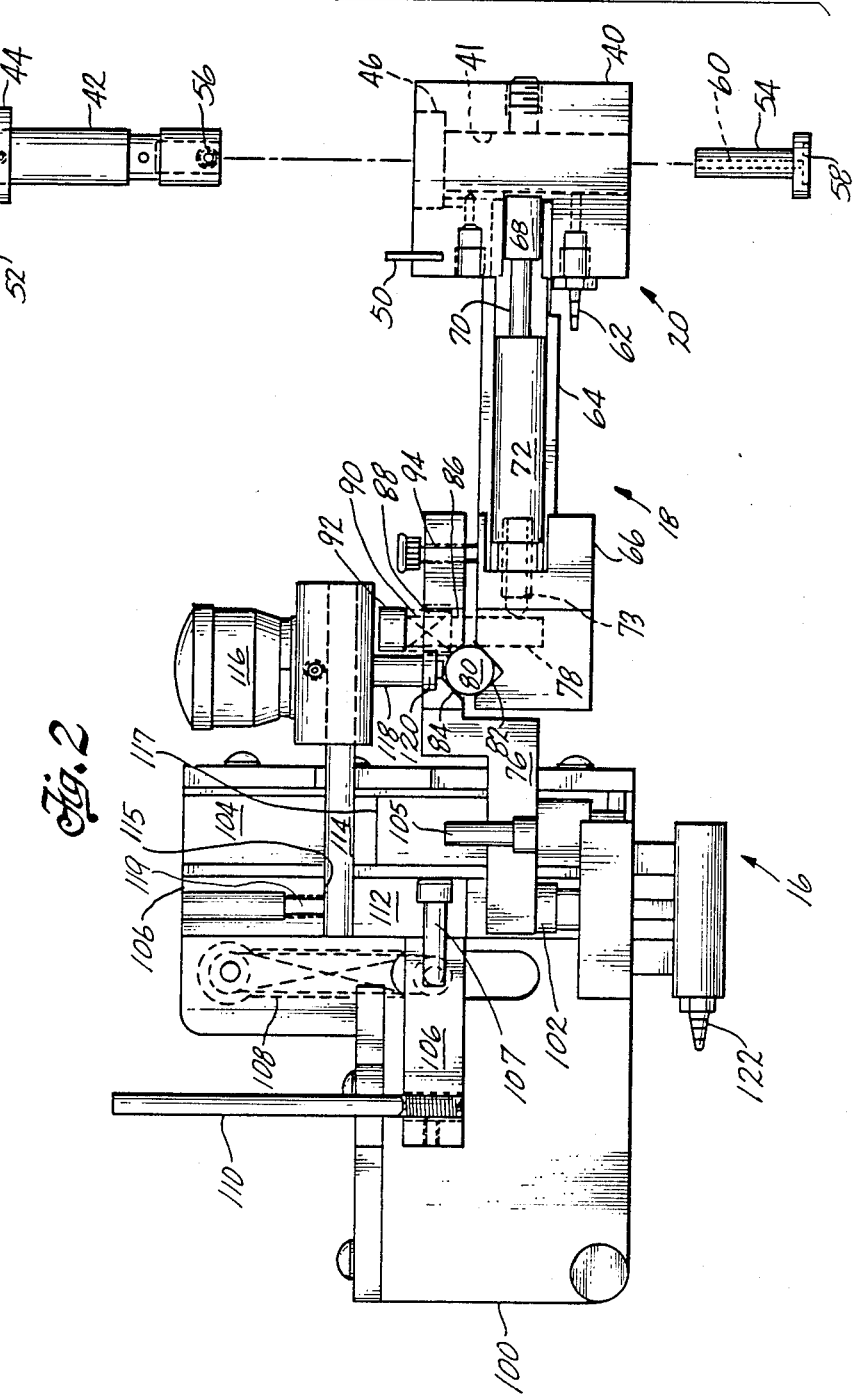

METHOD AND APPARATUS FOR BONDING WITH CONSISTENT UNIFORM BOND THICKNESS

FIELD OF THE INVENTION

This invention pertains to the field of bonding two objects together and, more particularly, in the field of semiconductor circuit construction to a method and apparatus for bonding a die and package base together, so that a consistent and uniform bond thickness is obtained.

BACKGROUND OF THE INVENTION

In the construction of semiconductor circuits, a large wafer is made first. To construct the individual circuits, the wafer is cut into smaller pieces called dies or chips. Each finished individual circuit is composed of a single die sealed in a two part package. Wires attached to the terminals on the die extend out of the package. In order to ground the die and to hold it in place in the package, the die is bonded to the package base.

At present, at least two different methods are used to bond dies to a package base. The first method is a eutectic gold silicon alloy, which must be performed under high heat. The gold silicon alloy has several drawbacks. First, because the bond must be made under heat, there is a great risk that the heat will oxidize the package and die. Second, to obtain 100% eutectic coverage under the die requires near perfect flatness of the die and package. Third, the gold silicon alloy and the die have different coefficients of expansion than the package. When the chip is heated or cooled, by use or by the environment, the gold silicon alloy and the package expand or contract at a different rate, which stresses the die. The stress can affect the operation of the circuitry in the die. If exposed to enough stress, the die can shatter.

Another material used to bond the die to the package is a silver glass paste. This paste is applied at a lower temperature and after firing has a coefficient of expansion which is very similar to that of the die and the package, avoiding the stress problems of the gold silicon alloy. However, with the silver glass paste, it is very important that the thickness of the paste in the bond, i.e., the distance between the package and die, be uniform across the entire mating surfaces of the package and die. It is also important that the overall thickness of the paste in the bond be within certain parameters.

The silver glass paste is a conductor, but not a perfect conductor. If the paste is too thick, i.e., the die is too far from the package, the resistance between the die and package is too high. As a result, the die will not be fully grounded, and excessive resistance heating develops in the paste. The heat negatively affects the circuitry in the die. If the paste is too thin, i.e., the die is too close to the package, then the package and die will not be sufficiently isolated and the bond strength will be negatively affected. Also, excess paste squeezed from between the package and die can lap over the top of the die and cause shorts. Similarly, if the paste thickness is not consistent across the width of the die, then hot spots can develop where the silver glass paste is thicker. Uneven heat stresses the die and affects the die's circuitry inconsistently. Gaps in the paste prevent the die from being fully grounded.

In the past, it has proven difficult to achieve uniform and consistent bond thickness with existing techniques. A typical die bonder uses a pneumatic clamp to lift individual dies by their top surface and a holding fixture to hold the package base by its bottom surface. The silicon glass paste is then placed on the package, and the die is pressed into the paste. An excess amount of paste is applied to the package, so that when the die is pushed into the paste, the excess paste is squeezed from between the die and the package. The squeezing helps ensure that there are no gaps or voids in the paste bond.

Two methods are commonly used to control the bond thickness. One method is to press the die into the package with a predetermined force. This method assumes a uniform silver glass paste viscosity, so that a consistent force results in a consistent bond thickness. However, the silver glass paste viscosity is not easily controlled, making the results generally inconsistent.

Another method depresses the die into the paste a preset distance. The preset distance is determined by the distance from the clamp to the holding fixture. This method assumes that the thickness of the package and the thickness of the die are consistent. However, since the desired bond thickness is on the order of 0.001 inch, variations in the thickness of the die and the package can result in substantial variations in the bond thickness.

SUMMARY OF THE INVENTION

The present invention includes a method for bonding together a package base and die. The method preferably includes placing a package base in a holding fixture, placing a die in a clamp, positioning the clamp and the holding fixture so that the die and the package base are in contact with each other, recording the position of the clamp and the holding fixture when the die and the package base are in contact with each other, separating the die and the package base so that a paste can be applied to either the die or the package, and, finally, returning the clamp and the holding fixture to a position which is a predetermined distance from the recorded position.

The invention also preferably comprises an apparatus for bonding a package base and a die together, which includes a holding fixture for retaining the package, a clamp for retaining a die, an arm for carrying the clamp, a support upon which the arm is mounted so that the clamp can be moved with respect to the holding fixture from a position in which the package base and die are in physical contact to a position in which the package base and die are sufficiently separated to allow a bonding substance to be placed on either the package base or the die, and a micrometer for setting the offset of the clamp with respect to the holding fixture so that the distance between the die and the package base can be adjusted. The invention in this way obtains a consistent uniform bond thickness, regardless of variations in the viscosity of the bonding substance and in the thickness of the die and the package base.

BRIEF DESCRIPTION OF THE DRAWINGS

FIG. 2 is a cross sectional and partially exploded view of the bonding apparatus from the side;

DETAILED DESCRIPTION OF THE INVENTION

Figure 1:
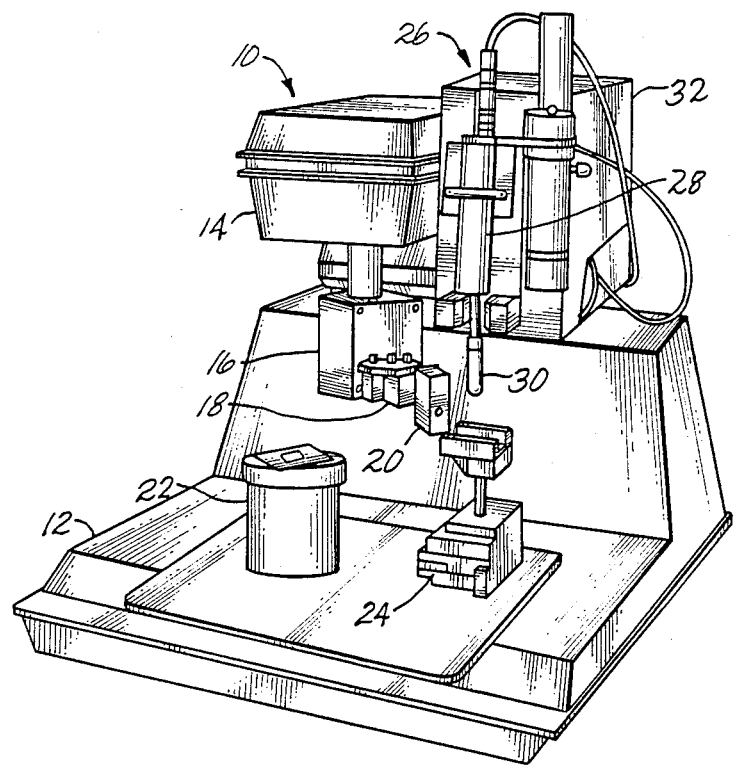
FIG. 1 is a perspective view of the bonding apparatus and associated machinery.

FIG. 1 shows a preferred embodiment of a bonding apparatus 10 and related equipment. The bonding apparatus 10 is mounted onto a table 12. The bonding apparatus has a base 14 mounted directly to the table. The base includes a variety of stepping motors (not shown) for regulating the various parts of the bonding apparatus 10. A support 16 extends downward from the bottom surface of the base 14 towards the table. An arm 18 extends horizontally from the support and is capable of pivoting in a horizontal plane parallel to the plane of the table and capable of being moved up and down vertically with respect to the table through use of the stepping motors. At the end of the arm is a clamp 20 that has components capable of sliding up and down vertically with respect to the table.

Also mounted on the table 12 is a pedestal 22. The pedestal is located within the reach of the clamp 20 so that a die may be placed on the pedestal 22 and picked up by the clamp 20. Also within the reach of the clamp is a holding fixture 24. A package (not shown) is placed on the holding fixture 24 so that the clamp 20, pivoting on a horizontal plane, can move from the pedestal 22, where it picks up the die to the holding fixture 24 where it places the die onto the package. A paste applicator 26 is also mounted to the table. The paste applicator 26 includes a silver glass paste tank 28, a paste gun 30, and a controller 32. The silver glass tank 28 holds the silver glass paste which is to be applied to each package. The paste gun 30 is located directly above the holding fixture 24 so that, when the clamp 20 is not over the package, paste can be applied by the paste gun 30 to the package. The paste controller 32 regulates the temperature and viscosity of the silver glass paste as well as the amount of paste dispensed.

FIG. 2 shows the bonding apparatus or bonder 10 in greater detail. The clamp 20 is made up of a solid clamp block 40. A bore 41 is drilled vertically through the clamp block 40, and a clamp shank 42 is inserted into the bore. The clamp shank 42 has a shank collar 44 at the top, which fits into an inset or counterbore 46 at the top end of the bore to limit the downward movement of the clamp shank. The shank includes a shank cap 48 above the shank collar, which covers the top of the clamp block 40. A dowel 50 extends vertically from the top of the clamp block 40 and fits into a hole 52 in the shank cap 48 to prevent the clamp shank 42 from rotating with respect to the camp block 40.

A die holder 54 is inserted through the bottom end of the bore in the clamp block 40 into the bottom of the clamp shank 42 and held in place by a set screw 56. The die holder has a die receptacle 58 at its lower end. The die receptacle 58 is an inset in the bottom of the die holder, which is approximately the same shape as the top of the die. The die receptacle 58 connects to a vacuum line bore 60 drilled through the die holder 54. This bore eventually communicates with a die holder vacuum coupling 62 so that, when a vacuum is applied to the coupling 62, a die placed in the die receptacle 58 will be held in place by the vacuum. The die holder 54 slides freely up and down or vertically with the clamp shank 42 within the bore in the clamp block 40. While it floats freely in a vertical direction, it does not pivot in the horizontal plane because it is held fast by the dowel 50.

The clamp 20 is connected to an arm 18. The arm connects directly to one side of the clamp block 40 and extends horizontally to the support 16 to which it is pivotally attached. The arm 18 is made up of a brake cylinder 64 and a pivot block 66 which is connected to one end of the brake cylinder. The other end of the brake cylinder 64 extends into the clamp block 40 to the bore 41 within the clamp block that contains the clamp shank 42. At this end of the brake cylinder is a brake shoe 68. The brake shoe is yoke shaped so that it fits around the clamp shank when pressed against the clamp shank. The opposite side of the brake shoe is connected to a brake shaft 70. Mounted on the brake shaft is a brake piston 72. The brake piston moves the shaft towards and away from the clamp shank 42 to actuate the brake shoe. The brake cylinder 64 is connected through a bore 73 to a brake pressurized gas coupling 74 shown in FIG. 3. When gas pressure is applied to the coupling 74, the brake shoe is pushed by the brake shaft 70 toward the clamp shank 42, locking it in place. When gas pressure is not applied, a spring retracts the brake shoe 68 from the clamp shank 42, allowing it to slide freely.

The brake cylinder 64 extends partially into the pivot block 66. The pivot block 66 is connected to a clamp carriage 76, which extends above the top surface of the pivot block 66. The pivot block is held onto the clamp carriage 76 by a retaining screw 78. In order that the pivot block 66 can pivot with respect to the clamp carriage 76 in a horizontal plane, the pivot block 66 and the clamp carriage 76 are held apart by a ball bearing 80, which sits in receptacles 82 and 84 in clamp carriage 76 and pivot block 66, respectively.

So that the tension on the ball bearing 80 may be adjusted and the pivot block may be pivoted with respect to the clamp carriage 76, the retaining screw 78, which is threaded into the pivot block 66, extends into the pivot block through a slot 86 in the clamp carriage 76. The slot 86 has a counter sink 88, which supports a spring 90 around the retaining screw 78. The spring 90 is held in place by a cap 92 on the end of the retaining screw 78. When the pivot block is pivoted, the retaining screw 78 slides to different positions in the slot 86. The tension on the spring 90 is adjusted using a nylon tipped spring adjustment screw 94, which extends through the clamp carriage 76 to meet and press against the top face of the pivot block 66. Two set screws 96 and 98, shown in FIG. 3, hold the pivot block 66 in place with respect to clamp carriage 76 once it has been pivoted into a desired position.

Opposite the pivot block 66, the clamp carriage 76 extends into a slide housing 100. The end of the clamp carriage 76 within the slide housing 100 rests on a carriage block or cylinder pad 102. However, the clamp carriage 76 is pushed upward by the carriage block 102 by gas pressure at various times as will be described later.

Figure 3:
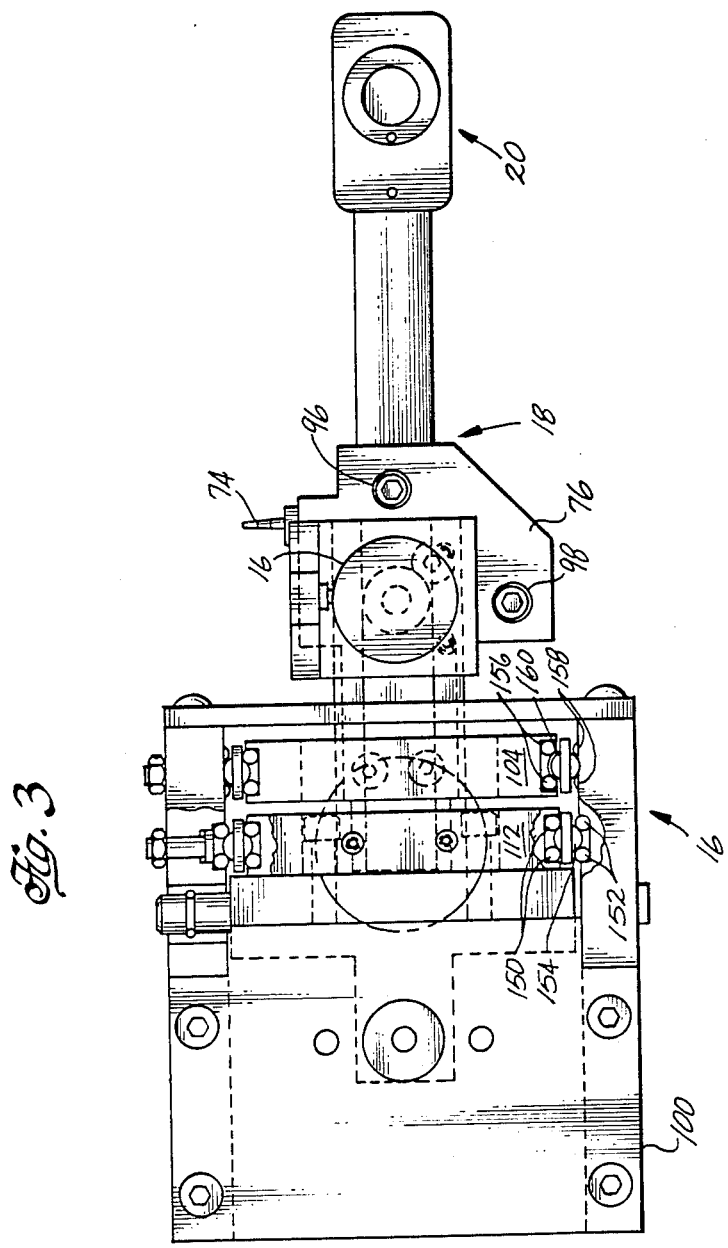
FIG. 3 is a cross sectional view of the bonding apparatus from the top.

The clamp carriage 76 is connected to a front slide assembly 104, which supports the entire weight of the clamp 20 and arm 18, by a screw 105 extending through the clamp carriage 76 and threaded into the lower end of slide assembly 104. A rear slide assembly 112 is journaled within the housing 100 to allow vertical movement. A rear slide plate 106 is horizontally aligned with a pivot point for support 16 and connects directly to the rear slide assembly 112 by a screw 107 extending through the rear slide assembly and threaded into one end of the rear slide plate. FIG. 3 shows inner race wires 150 connected to the rear side plate 106 and extending vertically within the housing 100, and outer race wires 152 connected to the housing 100, running parallel to the inner race wires 150. A ball bearing 154 rolls between the race wires so that the rear slide assembly moves freely within the housing.

The rear slide plate extends away from the arm from the back surface of the rear slide assembly in the horizontal plane. A counterbalance spring 108 is fastened midway along this extension to the rear slide plate 106 and to the housing 100. The spring counterbalances the weight of the arm and clamp assembly. The extreme en of the rear slide plate is connected to a push rod 110 which extends up into the base 14 shown in FIG. 1. The push rod 110 allows the vertical and pivoting motion of the rear slide to be controlled by stepping motors (not shown) within the base 14. Push rod 110 is vertically aligned with the pivot point for support 16.

The clamp carriage 76 is connected within the housing to the front slide assembly 104. The front slide assembly is journalled to allow vertical motion only. Pivotal motion is allowed only in combination with the pivoting of the rear slide assembly 112. FIG. 3 shows inner race wires 156 connected to the front slide assembly 104 and extending vertically within the housing 100. Outer race wires 158 are fastened to the housing and run parallel to the inner race wires. A ball bearing rolls between the wires, allowing the front slide assembly 104 to float freely between the wires. Both slides move freely in their journalled slots. However, the front slide assembly is slaved to the rear slide assembly by gravity as described in detail below.

A micrometer bracket 114 is mounted to the rear slide assembly 112. The micrometer bracket extends out of a close tolerance hole 115 extending horizontally through the rear slide assembly and through a wide tolerance hole 117 extending horizontally through the front slide assembly. A nylon tipped set screw 119 extending down through the rear slide assembly to contact the length of the micrometer bracket within hole 115 holds the micrometer bracket in place. A micrometer 116 is fastened to the micrometer bracket 114. The micrometer 116 has a pin 118 which extends down to a micrometer pad 120 on the top surface of the clamp carriage 76. The micrometer precisely controls how far the pin 118 extends down from the micrometer 116.

In normal operation, the clamp carriage 76 and front slide assembly 104 rest on micrometer bracket 114. Thus, the front slide assembly normally moves in concert with the rear slide assembly due to the action of gravity as micrometer bracket 114 is attached to the rear slide assembly. The micrometer pin 118 does not normally contact the micrometer pad 120. However, when gas pressure is applied to a micrometer pressurized gas coupling 122, located below the carriage block, the journalled front slide assembly 104 is pushed vertically upwards by the carriage block, which acts like a piston. The clamp carriage 76, which is connected to the front slide assembly 104, is the component pushed upwards by the carriage block 102 until the micrometer pad 120 on the clamp carriage 76 meets the micrometer pin 118. In this way, the micrometer controls the vertical location of the clamp carriage 76 during the application of gas pressure to nozzle 122 and, therewith, the die holder 54. When the gas pressure is disconnected, gravity draws the front slide assembly back down to rest upon the micrometer bracket. The wide tolerance of hole 117 allows the front slide assembly to move upward without contacting the lower surface of the micrometer bracket.

Figure 4:
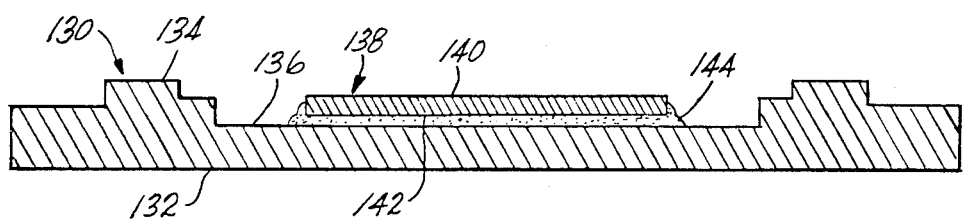
FIG. 4 is a cross sectional view of a bonded package base and die.

FIG. 4 shows a package base 130 with a bottom surface 132 and a top surface 134. The top surface has an inset 136 to which a die 138 is bonded. The die has a top surface 140 and a bottom surface 142. A silver glass paste 144 is applied between the package inset 136 and the bottom surface of the die 142.

Before the system can be operated, a number of settings must be adjusted. First, the clamp 20 and pedestal 22 must be adjusted so that the die receptacle 58 is precisely over the location on the pedestal 22 where a die would be placed when the support is pivoted to one extreme. This can be done by rotating the pivot block 66 with respect to the clamp carriage 76. The selected position is locked in using the set screws 96 and 98. The length of the arm can also be adjusted.

Second, the holding fixture 24 must be adjusted so that a die held in the die receptacle 58 will be placed directly in the center of the inset 136 of the package base which has been placed in the holding fixture 24 when the support is pivoted to its other extreme. This is regulated primarily by the position of the holding fixture and by the operation of the stepping motors which control the push rod 110.

Third, the micrometer 116 must be adjusted so that the distance between the micrometer pad 120, when the front slide assembly is resting on the micrometer bracket, and the micrometer pin 118 is equal to the desired bond thickness. The vertical position of the pedestal 22 and the holding fixture 24 are remembered by stepping motors (not shown) which control the push rod 110. The stepping motors insure that the clamp 20 returns to the same position each time to meet the pedestal 22 and the holding fixture 24. Sliding of the clamp shank within bore 41 when the brake shoe is not activated allows for some float in the vertical position of the die on the pedestal.

In operation, a die 138 is placed on the pedestal 22 so that its top surface 140 is facing upwards. A package base 130 is placed on the holding fixture 24 so that the package inset 136 is facing upwards. Next, the support is pivoted until clamp block 40 is directly over the pedestal 22. The rear slide assembly is then lowered until die receptacle 58 virtually rests on the top surface of the die 140. These movements are controlled by the stepping motors in the base 14 which drive the push rod 110. The push rod 110 moves the rear slide assembly 112, the front slide assembly 104, the clamp carriage 76, the arm 18, and finally the clamp 20.

When the clamp 20 is close enough to the die, a vacuum is applied to the die holder 54 at the die holding vacuum coupling 62, which draws the die into the die holder 54 and holds the die by its top surface. The push rod 110 then raises the clamp 20 above the pedestal 22. The push rod 110 is then turned about its vertical axis, pivoting the arm 18 until the clamp 20 rests above the package base 130. Then the clamp is lowered until the bottom surface of the die 142 comes to rest on the package inset 136. When the bottom surface of the die 142 meets the package inset 136, the clamp shank 42, which moves freely within the clamp block 40, is pushed upwards a small amount until the motor driving the push rod 110 stops. When the motor stops, the gas pressure at the brake pressurized gas coupling 74 is turned on. This drives the brake shoe 68 against the clamp shank 42, holding the clamp shank 42 in place. This step, in effect, measures the package base and the die, so that the bond thickness is measured independent of the thickness of the die 142 and the package base 130. This step also records the position of the clamp 20 and the holding fixture 24. As long as the clamp shank 42 is braked, the stepping motors, using well known techniques, can reliably return the die holder 54 to almost exactly the same position.

After the clamp shank 42 has been braked, the clamp 20 is moved upwards and pivoted away from the holding fixture 22. The paste gun 30 then lowers and applies a precisely measured amount of paste to the package inset 136, using conventional techniques well known in the art.

The clamp 20 is then returned to its position over the holding fixture 24, and gas pressure is applied at the micrometer pressurized gas coupling 122, raising the front slide assembly until the micrometer pad 120 meets the micrometer pin 118. The clamp 20 is then lowered so that the rear slide assembly 112 reaches exactly the same position that it reached before when the die 138 and the package base 130 were in contact with each other. This would ordinarily return the die holder 54 to the prerecorded position. However, because the front slide assembly has been raised by a distance measured precisely by the micrometer 116, the die holder has been raised by the same distance. The distance between the package inset 136 and bottom surface of the die 142 is exactly equal to the distance measured by the micrometer 116. This measurement is independent of the thickness of the die 138 and package base 130 and independent of the character of the silver glass paste.

As the die 138 is lowered into the silver glass paste 144, it pushes the paste out from between the bottom surface of the die 142 and the package inset 136 so that the space between these surfaces is uniformly filled with paste, and the excess is pushed aside. The paste is allowed a moment to stabilize, a dwell time of about 1 to 15 seconds depending on die size is presently preferred, then the vacuum at the die holder vacuum coupling 62 is released, releasing the die 138 from the die holder 54. The clamp 20 is raised away from the holding fixture, and the clamp is then pivoted away from the holding fixture 24 so that the bonded die and package base combination can be removed.

To reset the system, the brake cylinder gas pressure is relaxed, allowing the clamp shank 42 to fall to its resting position held by the shank collar 44, and the gas pressure at the micrometer pressurized gas coupling 122 is disconnected, allowing the front slide assembly to fall to rest on the micrometer bracket. The process begins again when a new die is placed on the pedestal 22, and a new package base is placed on the holding fixture 24.

The present invention compensates for variations in the thickness of the die and the package by precisely measuring the location of the clamp when the die and package base are in physical contact. Having first measured this position, a consistent bond thickness can be obtained simply by raising the clamp a distance corresponding to the desired bond thickness. The present embodiment accomplishes this using the double slide assemblies and the micrometer. However, this can be accomplished in a number of different ways and it is not intended by describing only one embodiment to limit the spirit and scope of the invention to this single embodiment. Similarly, while the invention has been described as a method and apparatus for bonding a die and package base, the invention can also be used with any other objects where a consistent bond thickness is desired. While the invention was described using a silver glass paste applicator including a paste gun, the invention may be implemented using any other bonding material and any other device for applying the bonding material to one or both of the objects to be bonded.

Using conventional stepping motors which are well known in the art and associated equipment, the present embodiment of the invention can easily maintain a bond thickness tolerance of 0.0005 inch. It works equally well on very large and very small dies and can be easily adapted to bond other materials. Conventional stepping motors can place the die accurately to plus or minus 0.001 inch, and a complete bonding cycle can be completed in seven seconds.

What is claimed is:

1. In bonding two objects together, an apparatus comprising:
   a holding fixture for retaining the first object;
   a clamp for retaining the second object, the clamp comprising a clamp block and an object holder slidably mounted to the clamp block and the clamp being movable from a position in which the two objects are in physical contact, to a position in which the two objects are sufficiently spaced apart to allow a bonding substance to be placed on at least one of the two objects;
   an arm for supporting the clamp;
   a support for supporting the arm, the arm being pivotally mounted to the support;
   means for recording the position of the holding fixture and the clamp when the two objects are in physical contact, the means for recording comprising a brake for fixing the position of the object holder with respect to the clamp block;
   micrometer means for moving the clamp with respect to the holding fixture so that the distance between the two objects can be adjusted; and
   means for returning the holding fixture and the clamp to the recorded position, the means being subject to the adjustments of the micrometer means.

2. In bonding two objects together, an apparatus comprising:
   a holding fixture for retaining the first object;
   a clamp for retaining the second object, the clamp being movable from a position in which the two objects are in physical contact, to a position in which the two objects are sufficiently spaced apart to allow a bonding substance to be placed on at least one of the two objects;
   an arm for supporting the clamp;
   a support for supporting the arm, the arm being pivotally mounted to the support, the support comprising a housing, a rear slide assembly slidably mounted to the housing and a front slide assembly fastened to the arm and slidably mounted to the housing, the front slide assembly being supported by the rear slide assembly;
   means for recording the position of the holding fixture and the clamp when the two objects are in physical contact;
   micrometer means for moving the clamp with respect to the holding fixture so that the distance between the two objects can be adjusted; and
   means for returning the holding fixture and the clamp to the recorded position, the means being subject to the adjustments of the micrometer means.

* * * * *